(12) United States Patent
Choi et al.

(10) Patent No.: US 11,505,088 B2
(45) Date of Patent: Nov. 22, 2022

(54) VEHICLE AND CONTROL METHOD THEREOF

(71) Applicants: HYUNDAI MOTOR COMPANY, Seoul (KR); KIA MOTORS CORPORATION, Seoul (KR); The Industry & Academic Cooperation in Chungnam National University (IAC), Daejeon (KR)

(72) Inventors: WonJae Choi, Uiwang-si (KR); Hee Yeon Ryu, Yongin-si (KR); Ju Seok Kim, Suwon-si (KR); Jaekyung Oh, Suwon-si (KR); Jonghoon Kim, Daejeon (KR); Jinhyeong Park, Yeongdong-eup (KR)

(73) Assignees: HYUNDAI MOTOR COMPANY, Seoul (KR); KIA MOTORS CORPORATION, Seoul (KR); The Industry & Academic Cooperation in Chungnam National University (IAC), Daejeon (KR)

( * ) Notice: Subject to any disclaimer, the term of this patent is extended or adjusted under 35 U.S.C. 154(b) by 183 days.

(21) Appl. No.: 16/994,046

(22) Filed: Aug. 14, 2020

(65) Prior Publication Data
US 2021/0155117 A1 May 27, 2021

(30) Foreign Application Priority Data
Nov. 26, 2019 (KR) .......................... 10-2019-0153346

(51) Int. Cl.
*B60L 58/22* (2019.01)
*G01R 31/396* (2019.01)
*B60L 58/12* (2019.01)

(52) U.S. Cl.
CPC ............... *B60L 58/22* (2019.02); *B60L 58/12* (2019.02); *G01R 31/396* (2019.01)

(58) Field of Classification Search
CPC .......... B60L 58/22; B60L 58/12; B60L 58/10; B60L 3/0046; B60L 58/18; B60L 58/21;
(Continued)

(56) References Cited

U.S. PATENT DOCUMENTS 10,261,134 B2   4/2019   Joe
10,268,882 B2 *  4/2019   Lee ...................... G06K 9/6293
(Continued)

FOREIGN PATENT DOCUMENTS

CA   2588856 A1   6/2006
EP   3045925 A1   7/2016
(Continued)

OTHER PUBLICATIONS

European Search Report cited in European Patent app No. 20190462.0; dated Feb. 15, 2021; 7 pp.
(Continued)

*Primary Examiner* — M Baye Diao
(74) *Attorney, Agent, or Firm* — Lempia Summerfield Katz LLC (57) ABSTRACT

A vehicle includes: a battery module including a plurality of battery cells; a battery pack including a plurality of battery modules; a battery cell sensor configured to measure voltages of the plurality of battery cells; a battery module sensor configured to measure a voltage of the battery module and a current of the battery module; and a controller configured to perform data processing based on the data obtained by the battery cell sensor and the battery module sensor.

16 Claims, 7 Drawing Sheets

(58) Field of Classification Search
CPC ......... B60L 2240/547; B60L 2240/549; G01R 31/396; G01R 31/3648; G01R 31/367; G01R 31/3842; H01M 2010/4271; H01M 2220/20; H01M 10/425; H01M 10/441; H01M 10/482; H01M 50/204; H01M 50/249; Y02E 60/10; Y02T 10/70
USPC ......................................................... 320/116
See application file for complete search history.

(56) References Cited

U.S. PATENT DOCUMENTS

| | | | |
|---|---|---|---|
| 10,422,834 B2 | 9/2019 | Tang | |
| 10,422,837 B2 | 9/2019 | Park | |
| 10,527,678 B2 | 1/2020 | Lee | |
| 11,125,827 B2 * | 9/2021 | Wild | H01M 10/052 |
| 2006/0100833 A1 * | 5/2006 | Plett | H01M 10/48 703/2 |
| 2009/0189613 A1 * | 7/2009 | Plett | G01R 31/3842 324/426 |
| 2015/0158395 A1 | 6/2015 | Li et al. | |
| 2016/0195587 A1 | 7/2016 | Lee | |
| 2016/0202325 A1 | 7/2016 | Tang | |
| 2016/0259012 A1 * | 9/2016 | Sejima | G01R 31/367 |
| 2016/0363632 A1 | 12/2016 | Park | |
| 2017/0199247 A1 | 7/2017 | Joe | |
| 2018/0032802 A1 * | 2/2018 | Lee | G06K 9/6293 |
| 2019/0235027 A1 | 8/2019 | Sugiura et al. | |
| 2020/0391610 A1 * | 12/2020 | Park | G01R 31/396 |
| 2022/0082626 A1 * | 3/2022 | Lim | G01R 31/3842 |

FOREIGN PATENT DOCUMENTS

| | | | | |
|---|---|---|---|---|
| EP | 3165934 A1 | | 5/2017 | |
| GB | 2537406 A | * | 10/2016 | ............... B60L 58/12 |
| JP | 2008522153 A | * | 6/2008 | ........... H01M 6/5083 |
| JP | 4511600 B2 | * | 7/2010 | ............. H01M 10/48 |
| JP | 2010239710 A | * | 10/2010 | ......... G01R 31/3648 |
| KR | 20160085070 A | | 7/2016 | |
| KR | 20160146032 A | | 12/2016 | |
| WO | WO-2010016647 A1 | * | 2/2010 | ......... G01R 31/3648 |

OTHER PUBLICATIONS

Liu-Henke Xiaobo et al, Verification oriented development of a scalable battery management system for lithium-ion batteries, 2017 Twelfth International Conference on Ecological Vehicles and Renewable Energies (EVER), IEEE, Apr. 11, 2017, 7 pp.

* cited by examiner

VEHICLE AND CONTROL METHOD THEREOF

CROSS-REFERENCE TO RELATED APPLICATION

This application is based on and claims priority under 35 U.S.C. § 119 to Korean Patent Application No. 10-2019-0153346, filed on Nov. 26, 2019 in the Korean Intellectual Property Office, the disclosure of which is incorporated herein by reference.

BACKGROUND

1. Field

The disclosure relates to a vehicle and a control method thereof. In particular, the disclosure relates to a vehicle for managing the charge amount of a vehicle battery pack, and a control method thereof.

2. Description of the Related Art

Electrical energy for driving an electric vehicle is supplied by a battery system. The battery system may be driven by using batteries having different characteristics depending on the driving environment. In this case, the energy storage system (ESS) may have a problem due to overcharge or over discharge due to voltage imbalance between battery cells or battery modules.

Therefore, in order to estimate the state of the battery module or the battery pack, the battery system needs to identify and control the state of the battery cell, which is a lower component, through various sensors.

However, a large number of battery cells are configured in a vehicle. In order to determine the state of each of the battery cells, a plurality of sensors corresponding to the number of battery cells are required. Therefore, it is difficult to determine the state of each battery cell since a communication device having a high specification is required in order to process information obtained by the plurality of sensors.

SUMMARY

Therefore, it is an aspect of the disclosure to provide a vehicle for constructing a battery system of the vehicle using a small number of sensors and operating a stable battery system, and a control method thereof.

In accordance with one aspect of the disclosure, a vehicle includes: a battery module including a plurality of battery cells; a battery pack including a plurality of battery modules; a battery cell sensor configured to measure voltages of the plurality of battery cells; a battery module sensor configured to measure a voltage of the battery module and a current of the battery module; and a controller. The controller is configured to perform data processing based on the data obtained by the battery cell sensor and the battery module sensor. The controller is configured to: obtain a first charge amount of the battery cell and a correction value of the battery cell based on the voltage of the battery cell and the current of the battery module; obtain a first error covariance of the battery cell and Kalman gain of the battery cell based on the first charge amount of the battery cell and the correction value of the battery cell; obtain a second error covariance of the battery cell by fusing the first error covariance and the Kalman gain; obtain a charge amount of the battery module and a charge amount of the battery pack based on the voltage of the battery module, the current of the battery module, the second error covariance, and the Kalman gain; obtain a second charge amount of the battery cell corrected from the first charge amount based on the charge amount of the battery module and the charge amount of the battery pack; and output a second charge amount of the battery cell.

The controller may be configured to obtain the first charge amount of the battery cell and the correction value of the battery cell based on a value obtained by dividing the current of the battery module by the parallel number of the battery module.

The controller may be configured to obtain the first error covariance and the Kalman gain based on an extended Kalman filter.

The correction value of the battery cell may include an estimated voltage of the battery cell, a model error of the battery cell, and a system variable of the battery cell.

The controller may be configured to determine an initial value based on a pre-stored charge/discharge curve.

The controller may be configured to output a charge amount of the battery pack when the second charge amount of the battery cell is 20% or more and 80% or less than a full charge amount of the battery pack.

The controller may be configured to output a full charge amount of the battery cell when the second charge amount of the battery cell is greater than 80% of the full charge amount of the battery cell.

The controller may be configured to output a minimum charge amount of the battery cell when the second charge amount of the battery cell is less than 20% of the fullcharge amount of the battery cell.

In accordance with another aspect of the disclosure, a control method of a vehicle, includes: measuring a voltage of the battery cell, a voltage of the battery module and a current of the battery module; obtaining a first charge amount of the battery cell and a correction value of the battery cell based on the voltage of the battery cell and the current of the battery module; obtaining a first error covariance of the battery cell and Kalman gain of the battery cell based on the first charge amount of the battery cell and the correction value of the battery cell; obtaining a second error covariance of the battery cell by fusing the first error covariance and the Kalman gain; obtaining a charge amount of the battery module and a charge amount of the battery pack based on the voltage of the battery module, the current of the battery module, the second error covariance, and the Kalman gain; obtaining a second charge amount of the battery cell corrected from the first charge amount based on the charge amount of the battery module and the charge amount of the battery pack; and outputting a second charge amount of the battery cell.

The obtaining the first charge amount of the battery cell and the correction value of the battery cell may include: obtaining the first charge amount of the battery cell and the correction value of the battery cell based on a value obtained by dividing the current of the battery module by the parallel number of the battery module.

The obtaining the first error covariance of the battery cell and Kalman gain of the battery cell may include obtaining the first error covariance and the Kalman gain based on an extended Kalman filter.

The correction value of the battery cell may include an estimated voltage of the battery cell, a model error of the battery cell, and a system variable of the battery cell.

The obtaining the first charge amount of the battery cell and the correction value of the battery cell based on the voltage of the battery cell and the current of the battery module may include determining an initial value based on a pre-stored charge/discharge curve.

The outputting the second charge amount of the battery cell may include outputting a charge amount of the battery pack when the second charge amount of the battery cell is 20% or more and 80% or less than a full charge amount of the battery pack.

The outputting the second charge amount of the battery cell may include outputting a full charge amount of the battery cell when the second charge amount of the battery cell is greater than 80% of the full charge amount of the battery cell.

The outputting the second charge amount of the battery cell may include outputting a minimum charge amount of the battery cell when the second charge amount of the battery cell is less than 20% of the full charge amount of the battery cell.

BRIEF DESCRIPTION OF THE DRAWINGS

These and/or other aspects of the disclosure should become apparent and more readily appreciated from the following description of the embodiments, taken in conjunction with the accompanying drawings of which.

DETAILED DESCRIPTION

Like numerals refer to like elements throughout the specification. Not all elements of embodiments of the disclosure are described. A description of elements that are commonly known in the art or that overlap with each other in the embodiments has been omitted. The terms as used throughout the specification, such as "~part", "~module", "~member", "~block", etc., may be implemented in software and/or hardware, and a plurality of "~parts", "~modules", "~members", or "~blocks" may be implemented in a single element, or a single "~part", "~module", "~member", or "~block" may include a plurality of elements.

It should be further understood that the term "connects" or its derivatives refers both to direct and indirect connection. The indirect connection includes a connection over a wireless communication network.

It should be further understood that the terms "comprise," "comprises," and/or "comprising," when used in this specification, identify the presence of stated features, integers, steps, operations, elements, and/or components. Such terms do not preclude the presence or addition of one or more other features, integers, steps, operations, elements, components, and/or groups thereof, unless the context clearly indicates otherwise.

In the specification, it should be understood that, when a member is referred to as being "on/under" another member, it may refer to being directly on/under the other member, or one or more intervening members may also be present.

The terms including ordinal numbers like "first" and "second" may be used to explain various components, but the components are not limited by the terms. The terms are only for the purpose of distinguishing a component from another.

As used herein, the singular forms "a," "an" and "the" are intended to include the plural forms as well, unless the context clearly indicates otherwise.

Hereinafter, the operating principles and embodiments of the disclosure are described with reference to the accompanying drawings.

Figure 1:
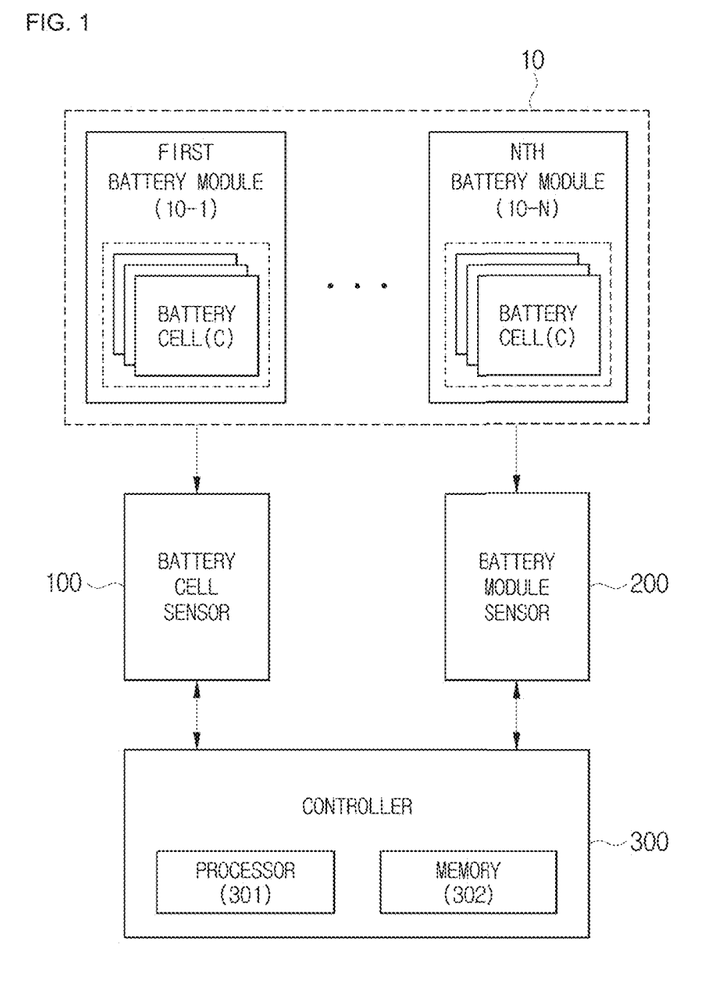
FIG. 1 is a block diagram of a battery system of a vehicle according to an embodiment of the disclosure.
Figure 2:
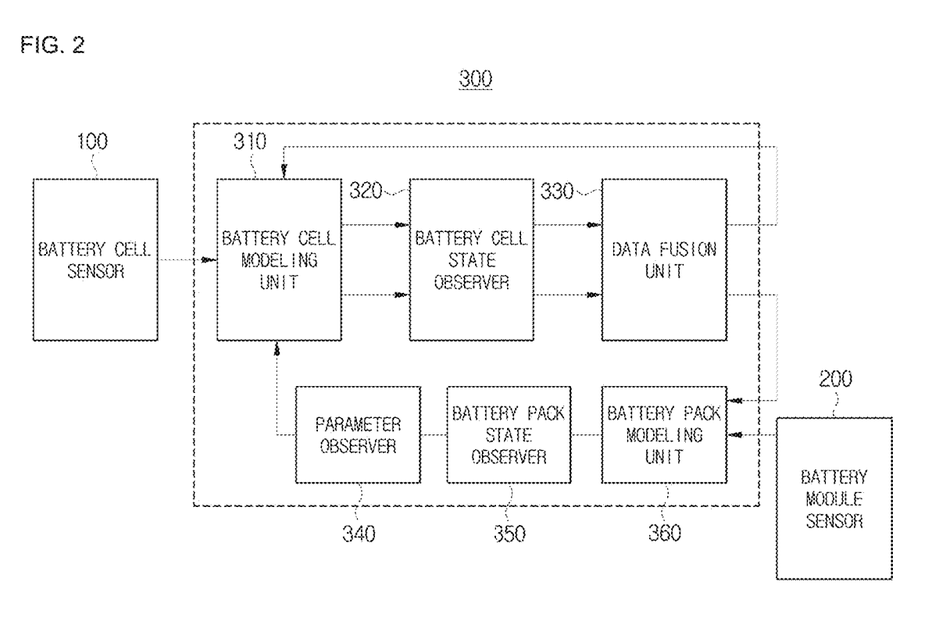
FIG. 2 is a control block diagram of a battery system of a vehicle according to an embodiment of the disclosure.

FIG. 1 is a block diagram of a battery system of a vehicle according to an embodiment of the disclosure. FIG. 2 is a control block diagram of a battery system of a vehicle according to an embodiment of the disclosure.

The battery pack 10 may be configured by connecting a plurality of battery cells C in series to supply various output voltages to a vehicle. In addition, the battery pack 10 may be configured by connecting a plurality of battery cells C in parallel according to charge/discharge capacities required by the battery pack 10.

The battery cell C refers to the basic unit of the battery capable of charging and discharging electrical energy. For example, the battery cell C may be composed of a positive electrode, a negative electrode, a separator, an electrolyte, and an aluminum case. In this example, the battery cell C may include various secondary batteries such as lithium ion batteries, lithium polymer batteries, nickel cadmium batteries, nickel hydrogen batteries, nickel zinc batteries.

The battery pack 10 may first configure a battery module 10-1 to 10-N including at least one battery cell C when a plurality of battery cells C is connected in series and/or in parallel. The battery pack 10 may include at least one battery module 10-1 to 10-N and various sensors.

The battery pack 10 may be connected to the battery cell sensor 100 and the battery module sensor 200 or may be implemented as a single body including both the battery cell sensor 100 and the battery module sensor 200.

The battery cell sensor 100 may include a plurality of voltage sensors and measure the voltage of each of the battery cells C. In another example, the battery cell sensor 100 may include a plurality of voltage sensors and a plurality of current sensors. The battery cell sensor 100 may measure both the voltage and the current of each of the battery cells C.

The battery module sensor 200 may include a plurality of voltage sensors and a plurality of current sensors. The battery module sensor 200 may measure voltages and currents of the battery modules 10-1 to 10-N.

The battery cell sensor 100 and the battery module sensor 200 may be connected to the controller 300 and provide the obtained data to the controller 300 so that the controller 300 performs data processing. The battery cell sensor 100 measures the voltage of the battery cell. The battery module sensor 200 measures the voltage of the battery module. The battery cell sensor 100 and the battery module sensor 200 may provide the controller 300 with the voltage of the battery cell, the voltage of the battery module, and the current of the battery module.

The controller 300 may include at least one non-transitory computer-readable medium or memory 302 in which a program including computer-executable instructions for performing the above-described operation and the operation described below may be stored. The controller 300 may include at least one processor 301 for executing the stored program. When the controller 300 includes a plurality of memories 302 and a plurality of processors 301, the plurality of memories 302 and the plurality of processors 301 may be integrated on one chip and may be physically separated.

The physical configuration of the controller 300 has been described above. Hereinafter, the components are classified based on the operation and computational aspects of the controller 300. The data flow and data processing performed by each component is described in detail below. In an example, referring to FIG. 2, the controller 300 may include a battery cell modeling unit 310, a battery cell state observer 320, a data fusion unit 330, a parameter observer 340, a battery pack state observer 350, and a battery pack modeling unit 360. However, the elements shown in FIG. 2 are schematically divided to help understand the data flow and the data processing process. There is no limitation on the subject of the operation.

The battery cell modeling unit 310 receives the voltage of the battery cell from the battery cell sensor 100. The battery pack modeling unit 360 receives the voltage of the battery module and the current of the battery module from the battery module sensor 200. The battery cell modeling unit 310 calculates a charge amount, i.e., a state of charge (SOC), an estimated voltage, a model error, and a system variable of each battery cell based on the voltage of the battery cell, the voltage of the battery module, and the current of the battery module. Specifically, the battery cell modeling unit 310 calculates an ideal current value of the battery cell based on a value obtained by dividing the current of the battery module measured by the battery module sensor 200 by the parallel number of battery cells included in the battery module. The battery cell modeling unit 310 may calculate a charge amount and a correction value (an estimated voltage of the battery cell, a model error of the battery cell, and a system variable of the battery cell) of each battery cell based on the calculated ideal current value of the battery cell.

The battery cell modeling unit 310 may calculate a charge amount of a battery cell which is a state variable to be estimated based on Equation 1 below.

$$x_{k,N} = f\left(x_{k-1,N}, \frac{u_k}{P}, \frac{\hat{\theta}^-_{k+1,pack}}{P}\right) + w^x_{k-1,N},$$

$$y^x_{k,N} = z\left(x_{k-1,N}, \frac{u_k}{P}, \frac{\hat{\theta}^-_{k+1,pack}}{P}\right) + v^x_{k-1,N}$$

⟨Equation 1⟩

In Equation 1, N denotes the number of battery cells in the battery pack, and P denotes the parallel number of the battery packs. $x_{k,n}$ denotes the charge amount of battery cells in battery pack, $u_k$, and $\theta_k$ denote current, and capacity of battery pack, respectively.

The first equation of Equation 1 is a state equation designed based on the current integration method. The second equation of Equation 1 corresponds to a measurement equation based on the terminal voltage of the battery pack. In general, the current integration method requires a current value. However, since the battery cell sensor 100 measures only a voltage, the current value may use a value of the ideal current of the battery cell calculated based on a value obtained by dividing the current of the battery module measured by the battery module sensor 200 by the parallel number of battery cells.

The battery pack modeling unit 360 may calculate the charge amount of the battery pack, which is a state variable to be estimated, and the capacity of the battery pack, based on Equation 2 below.

$$\begin{cases} x_{k,pack} = f(x_{k-1,pack}, u_{k-1}, \theta_{k-1,pack}) + w^x_{k-1,N} \\ y^x_{k,pack} = z(x_{k-1,pack}, u_{k-1}, \theta_{k-1,pack}) + w^x_{k-1,pack} \end{cases},$$

$$\begin{cases} \theta_{k,pack} = \theta_{k-1,pack} + w^\theta_{k-1,pack} \\ y^\theta_{k,pack} = z(x_{k-1,pack}, u_{k-1}, \theta_{k-1}) + w^\theta_{k-1,pack} \end{cases}$$

⟨Equation 2⟩

In Equation 2, $x_k$ denotes the charge amount of battery pack, $y_{k,pack}^x$ and $y_{k,pack}^\theta$ denote the measurement equation.

On the other hand, as shown in Equation 2, since the battery pack modeling unit 360 has two state variables to be measured, each of the state equation and the measurement equation may be divided into two parts. Therefore, the battery pack modeling unit 360 may update information about the charge amount of the battery module, the capacity of the battery module, and the terminal voltage based on the voltage of the battery module and the current of the battery module.

The noise information applied in the extended Kalman filter may be used to predict the state of the battery system. In this case, as shown in Equation 3 below, the noise information may be defined as a constant value based on the above-described state equation and measurement equation.

$$w^x \sim N(0, Q_N^x), v_N^x \sim N(0, R_N^x)$$

$$w_{pack}^x \sim N(0, Q_{pack}^x), v_{pack}^x \sim N(0, R_{pack}^x), w_{pack}^\theta \sim N(0, Q_{pack}^\theta), v_{pack}^\theta \sim N(0, R_{pack}^\theta)$$

⟨Equation 3⟩

In Equation 3, $w^x$, $v^x$, $w^\theta$, and $v^\theta$ are independent variables. $R^x$, $Q^x$, $R^\theta$, and $Q^\theta$ are covariance matrices for gaussian noise.

The battery cell state observer 320 calculates a first error covariance of each charge amount of each battery cell and a Kalman gain of the battery cell based on the extended Kalman filter (EKF). The battery cell state observer 320 may correct the charge amount of the battery cell that is primarily calculated based on the calculated first error covariance and the Kalman gain.

On the other hand, as shown below in Equation 4, the extended Kalman filter referred to in the present embodiment may use the above-described state equation and measurement equation as state variables of the system and take a partial derivative to linearize the nonlinear system.

$$A_{K,N} = \left.\frac{\partial f\left(x_{k,N}, \frac{u_k}{P}, \frac{\hat{\theta}^-_{k+1,pack}}{P}\right)}{\partial x_N}\right|_{x_k = \hat{x}_K^+},$$

$$H_{K,N} = \left.\frac{\partial z\left(x_{k,N}, \frac{u_k}{P}, \frac{\hat{\theta}^-_{k+1,pack}}{P}\right)}{\partial x_N}\right|_{x_{k,N} = \hat{x}_{K,N}^-}$$

$$A_{K,pack} = \left.\frac{\partial f\left(x_{k,N}, \frac{u_k}{P}, \hat{\theta}^-_{k,pack}\right)}{\partial x_N}\right|_{x_k = \hat{x}_K^-},$$

$$H_{K,pack} = \left.\frac{\partial z(x_{k,pack}, u_k, \hat{\theta}^-_{k,pack})}{\partial x_N}\right|_{x_k = \hat{x}_K^-}$$

$$C_{K,pack} = \left.\frac{dz(\hat{x}^-_{K,pack}, u_k, \theta_{pack})}{d\theta_{pack}}\right|_{\theta = \hat{\theta}_K^-}$$

⟨Equation 4⟩

In Equation 4, $A_K$ and $C_K$, denote the Jacobians of state equation, $H_K$, denotes the Jacobians of measurement equation.

On the other hand, in order to calculate the error covariance referred to in this embodiment, it is necessary to set the initial value. In this case, the error covariance may be calculated by Equation 5 below. The error covariance may include the error covariance for charge amount and the error covariance for capacity.

$$P_{0,N}=(SOC_{table,N}(OCV_{table,N})-SOC_{0,N})^2$$

$$P_{0,pack}=(SOC_{table,pack}(OCV_{table,pack})-SOC_{0,pack})^2,$$
$$S_0=0 \qquad \text{<Equation 5>}$$

In Equation 5, $P_{o,N}$ denotes the initial error covariance of battery cells in battery pack, and $P_{o,pack}$ denotes the initial error covariance of battery pack. The $SOC_{table,N}$ and $OCV_{table,N}$ denote SOC and OCV data acquired from FIG. 4.

Figure 4:
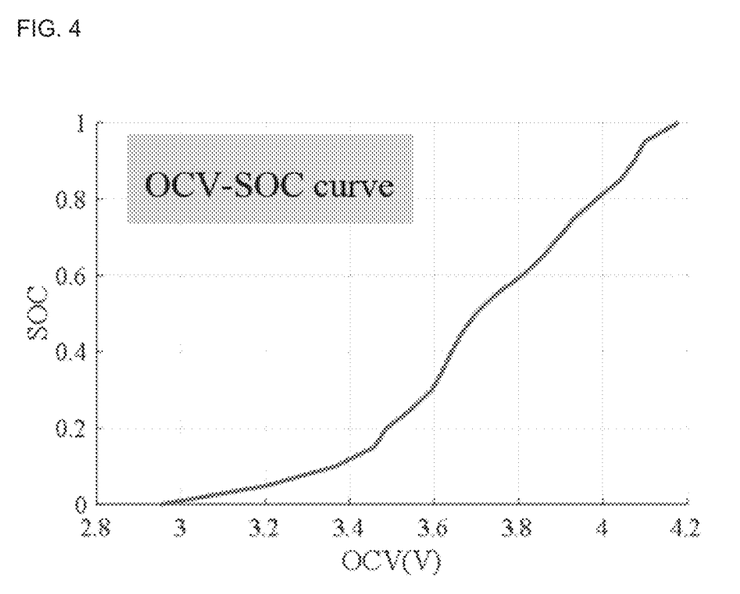
FIG. 4 illustrates a charge/discharge curve according to an embodiment of the disclosure.

The error covariance may have various values according to the initial value. The initial value may be set as a constant as shown in Equation 6 below. However, the accuracy may be lowered depending on the initial charge state or the error covariance of the battery cell/module/pack. Therefore, the calculation of the error covariance according to the present embodiment may be performed according to an initial value based on a prestored charge/discharge curve. Referring to FIG. 4, a graph showing the relationship between the open circuit voltage (OCV)-SOC is illustrated. The charge/discharge curve corresponds to the stored data reflecting the characteristics of the battery extracted by the electrical characteristic experiment in advance.

$$\hat{x}_{0,N}=\hat{x}_{0,pack}=0, \hat{\theta}_{0,pack}=\text{Capacity}_{initial} \qquad \text{<Equation 6>}$$

In Equation 6, $x_{o,N}$ denotes the initial charge amount of battery cells in battery pack, $x_{o,pack}$ denotes the initial charge amount of battery pack, and $\theta_{o,pack}$ denotes the initial Capacity of battery pack.

The data fusion unit 330 receives the first error covariance of the battery cell and the Kalman gain of the battery cell from the battery state observer 320. The data fusion unit 330 generates a second error covariance and Kalman gain which are new data that combines the first error covariance and the Kalman gain. In this case, the Kalman gain may be provided to the battery pack modeling unit 360 to estimate and correct the charge amount of the battery module, and the second error covariance may be provided to the battery cell modeling unit 310 to correct the error covariance of the battery cell.

When the initial value of the error covariance is determined, the data fusion unit 330 calculates a second error covariance based on the first error covariance and the Kalman gain. The second error covariance of the capacity and the capacity of the battery pack may be updated based on Equation 7 below and the above-described state equation of the battery pack. In addition, the capacity of the battery module may be determined based on the capacity of the battery pack.

$$\hat{\theta}_{K+1,pack}=\hat{\theta}_{K,pack}{}^+, S_{K+1}{}^-=S_K{}^++Q^\theta \qquad \text{<Equation 7>}$$

In Equation 7, $\theta_{K,pack}$ denotes the Capacity of battery pack, and $S_K$ denotes the error covariance of capacity. "−" means the predicted value and "+" denotes the calibrated value.

The battery pack modeling unit 360 calculates an estimated voltage of the battery pack 10 and a charge amount of the battery pack 10 based on model information and second error covariance of the battery module generated based on the voltage of the battery module and the current of the battery module. The battery pack modeling unit 360 provides the estimated voltage of the battery pack 10 and the charge amount of the battery pack 10 to the battery pack state observer 350. However, the battery pack state observer 350 does not apply the above-described extended Kalman filter. The battery pack state observer 350 may correct the charge amount of the battery pack 10 based on the error information of the battery pack 10, the Kalman gain generated by the battery cell state observer 320, and the charge amount of the battery pack 10 calculated by the battery pack modeling unit 360.

In detail, as shown in Equation 8 below, the battery pack state observer 350 may correct and update the charge amount of the battery cell and the battery pack based on the capacity of the battery pack.

$$|\hat{x}_{k+1,N}^- = f\left(x_{k,N}^+, \frac{u_k}{P}, \frac{\hat{\theta}_{k+1}^-}{P}\right), \qquad \text{<Equation 8>}$$

$$\hat{x}_{k+1,pack}^- = f(\hat{x}_{k,N}^+, u_k, \hat{\theta}_{k+1}^-),$$

$$P_{k+1,N}^- = A_{k,N} P_{k,pack}^+ A_{k,pack}^T A_{k,N}^T + Q_N^x$$

In Equation 8, $x_{k,N}$ denotes the charge amount of battery cells in battery pack, $x_{k,pack}$ denotes the charge amount of battery pack, and $\theta_{k,pack}$ denotes the capacity of battery pack.

The battery cell state observer 320 inputs values obtained by dividing the current of the battery module and the capacity of the battery module by the parallel number of battery cells included in the battery module to the state equation of the battery cell and may calculate the charge amount of each battery cell. In this case, the second error covariance of the battery pack may be applied as an error covariance of the charge amount of the battery cell. The error covariance of the charge amount of the battery cell may be calculated by applying noise parameters and system variables of each battery cell. The second error covariance, noise parameters and system variables may be used to obtain the Kalman gain. This is shown in Equation 9 below.

$$K_{k,N}^x = P_{k+1,pack}^- H_{k,N}^T (H_{k,N} P_{k+1,pack}^- H_{k,N}^T + R_N^x)^- \qquad \text{<Equation 9>}$$

In Equation 9, $K_{k,N}^x$ denotes the Kalman gain of battery cells in battery pack.

In addition, a voltage error with respect to the voltage of the battery cell measured by the battery cell sensor 100 may be obtained based on Equation 10 below. The charge amount of the current battery cell is corrected based on the obtained voltage error.

$$\hat{x}_{k+1,N}^+ = \hat{x}_{k+1,N}^- + K_{k,N}^x * \text{Error}_N \qquad \text{<Equation 10>}$$

In Equation 10, $\text{Error}_N$ denotes the model error of battery cells in battery pack.

The charge amount of the battery pack may be corrected based on the Kalman gain of each battery cell. The error covariance of the battery pack may be calculated based on the Kalman gain of the battery cell and a system variable. This is illustrated in Equations 11 and 12 below.

$$\hat{x}_{k+1,pack}^+ = \hat{x}_{k+1,pack}^- + \frac{1}{N}\sum_{N=1}^{N} K_{k,N}^x * \text{Error}_N \qquad \text{<Equation 11>}$$

$$P_{k+1,pack}^+ = \left(I + \frac{1}{N}\sum_{N=1}^{N} K_{k,N} H_{k,N}\right) P_{k+1,Pack}^- \qquad \text{<Equation 12>}$$

In Equation 11, $\hat{x}_{k+1,pack}^+$ denotes the calibrated charge amount of battery pack. $\hat{x}_{k+1,pack}^-$ denotes the predicted charge amount of battery pack, and N is the number of battery cells in battery pack.

In Equation 12, $P_{k+1,pack}^+$ is error covariance of charge amount in battery pack, and I is elementary matrix.

In the case of the capacity of the battery cell, the Kalman gain may be calculated based on Equation 13 below. The capacity of the battery cell is updated based on Equation 14. A second error covariance which is a new error covariance may be calculated based on the updated value as shown in Equation 15 below.

$$K_k^\theta = S_{k+1}^+ C_k^T (C_k S_{k+1}^- C_k^T + R^\theta)^- \qquad \text{<Equation 13>}$$

$$\hat{\theta}_{n,k+1}^+ = \hat{\theta}_{n,k+1}^- + K_k^\theta (z_k - \hat{z}_k) \qquad \text{<Equation 14>}$$

$$S_{k+1}^+ = (I - K_k H_k) S_{k+1}^- \qquad \text{<Equation 15>}$$

In Equation 13, $K_k^\theta$ denotes the Kalman gain of capacity in battery pack.

In Equation 14, $\hat{\theta}_{n,k+1}^+$ denotes the calibrated capacity of battery pack. $\hat{\theta}_{n,k+1}^-$ denotes the predicted capacity of battery pack.

In Equation 15, $S_{k+1}^+$ denotes the calibrated error covariance of capacity. $S_{k+1}^-$ denotes the predicted error covariance of capacity.

The parameter observer 340 calculates the capacity of the battery module 10 through the extended Kalman filter based on the charge amount of the battery module 10. In this case, the parameter used may be an error information of the battery pack output from the battery pack modeling unit 360, a system variable of the battery pack, and a charge amount of the battery pack. In this example, the capacity of the battery module itself may be estimated. The parameter observer 340 may calculate the value of the ideal capacity of the battery cell by dividing the capacity of the battery module by the parallel number. The calculated ideal capacity of the battery cell may be input to the battery cell modeling unit 310.

The data flow and data processing by each component included in the controller 300 have been described above. Hereinafter, a control method according to the order is described in detail with reference to FIG. 3.

Figure 3:
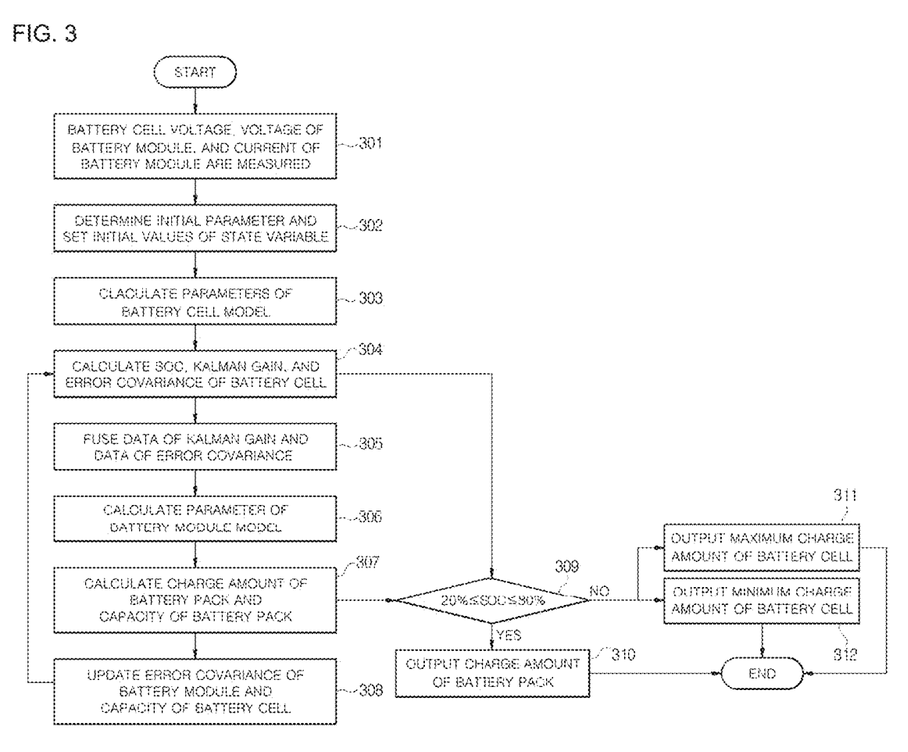
FIG. 3 is a flowchart illustrating a control method of a vehicle according to an embodiment of the disclosure.

FIG. 3 is a flowchart illustrating a control method of a vehicle according to an embodiment of the disclosure. However, this is only a preferred embodiment for achieving the object of the disclosure, some components may be added or deleted as necessary.

When the battery cell voltage, the voltage of the battery module, and the current of the battery module are measured (301), the controller 300 performs a calculation based on the voltage of the battery cell, the voltage of the battery module, and the current of the battery module.

The controller 300 determines initial parameters and sets initial values of state variables in order to calculate a charge amount, i.e., a state of charge (SOC), an estimated voltage, a model error and a system variable of each battery cell (302).

The controller 300 calculates the parameters of the battery cell model (303).

The controller 300 calculates the charge amount, the Kalman gain, and the error covariance of the battery cell (304). The result calculated in step 304 may be applied to the process of outputting the charge amount of the battery pack and the full/minimum charge amount of the battery cell.

The controller 300 fuses the data of the Kalman gain and the data of error covariance (305). In detail, the controller 300 may receive a first error covariance of the battery cell and a Kalman gain of the battery cell. The controller 300 may calculate a second error covariance, which is new data obtained by fusing the first error covariance and the Kalman gain.

The controller 300 calculates parameters of the battery module model (306). The controller 300 calculates a charge amount of the battery pack and a capacity of the battery pack (307). In this case, the charge amount of the battery pack and the capacity of the battery pack may be calculated based on the second error covariance.

The controller 300 updates the error covariance of the battery module and the capacity of the battery cell (308). The controller 300 calculates the new error covariance, the charge amount of the new battery cell and the capacity of the new battery cell by applying the updated error covariance and the capacity of the battery cell to step 304.

The controller 300 outputs the charge amount of the battery pack (310) when the charge amount of the battery cell is 20% or more and 80% or less (309), which is a safe region. When the charge amount of the battery cell exceeds 80%, which is an overcharge region, the battery cell outputs the full charge amount (311). When the charge amount of the battery cell is less than 20%, which is of the over discharge region, the battery cell may output the minimum charge amount (312). The battery cell may output the full or minimum charge amount to output the total charge amount by using information about the charge amount of a plurality of battery cells previously estimated based on the region of the total charge amount of the battery module for stable operation of the battery.

On the other hand, the disclosure does not utilize the current information in the battery cell unit, and only uses the voltage information. Therefore, it is possible to save the sensor used in the battery system. Nevertheless, the disclosure may accurately estimate the internal state of a plurality of battery cells.

Figure 5:
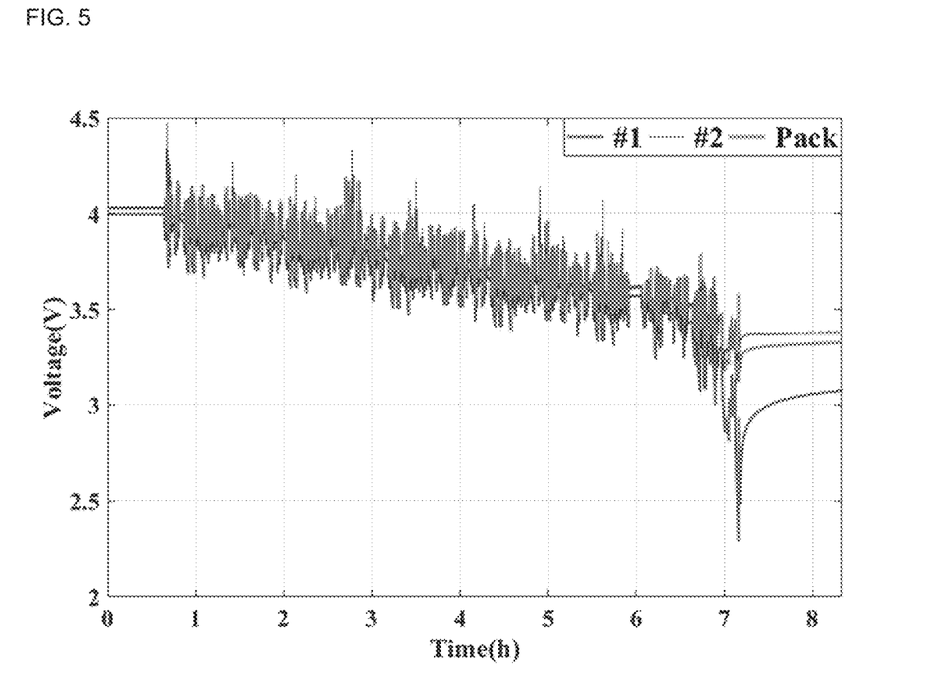
FIGS. 5 and 6 illustrate a change in voltage of the battery cell and a change in charge amount of the battery cell.
Figure 6:
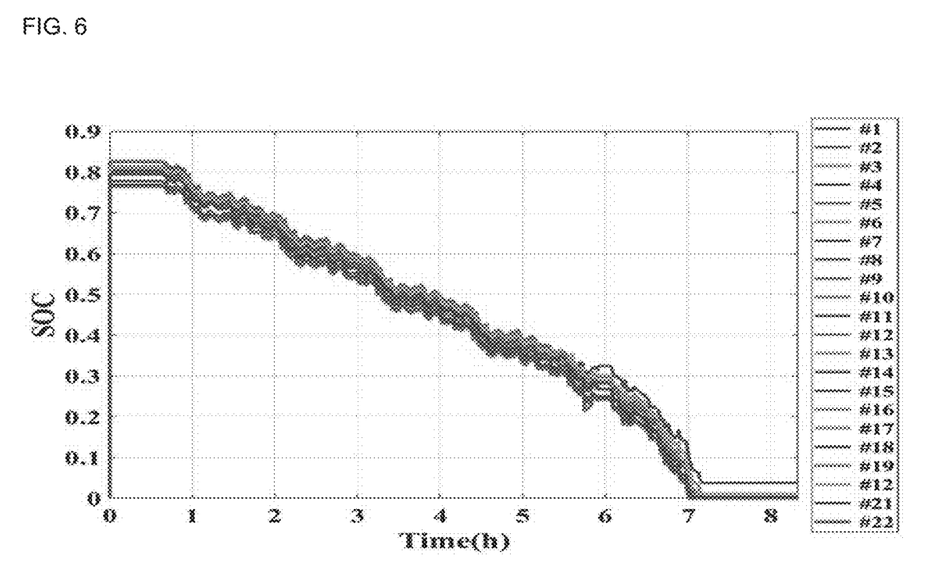

FIGS. 5 and 6 illustrate a change in voltage of the battery cell and a change in charge amount of the battery cell.

As shown in FIG. 5 and FIG. 6, as the battery cell ages, the voltage change in the region of the low charge amount becomes sharp. Therefore, in order to monitor the stable region of the battery based on the voltage of the battery cell, the sampling period of the control board should be small.

In addition, accurate voltage information is required to monitor based on the voltage. When the power is converted, the deviation between the battery cells may occur because it is not simply the voltage deviation information. In addition, when noise caused by external factors is applied to the voltage sensor, inaccurate voltage information may be measured, resulting in inferior stability or inaccurate control.

The disclosure is capable of diagnosing the state of each battery cell through data using an extended Kalman filter, and indirectly performing fault diagnosis of the battery cell included in the battery pack through the charge amount of the battery cell/module/pack. In other words, the disclosure enables indirect fault diagnosis through the amount of change in the charge amount.

Figure 7:
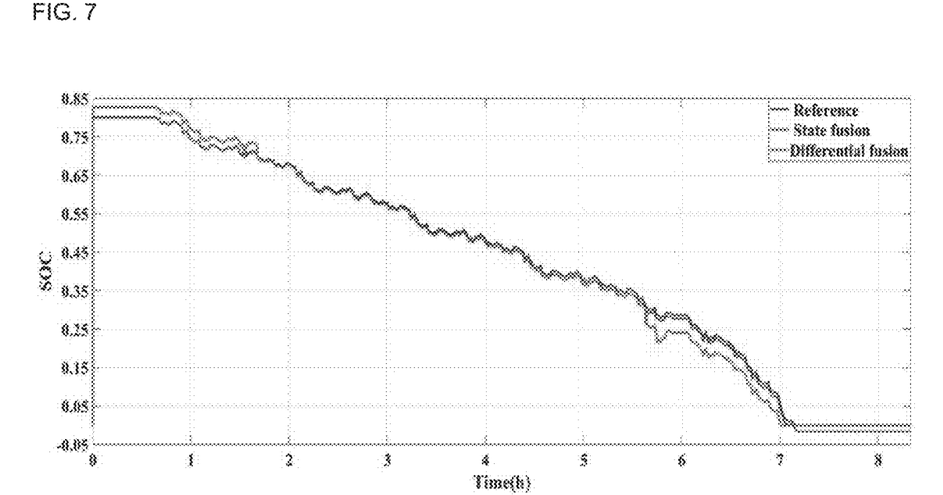
FIG. 7 illustrates a relationship diagram in reference to the charge amount output of the battery cell.

FIG. 7 illustrates a relationship diagram in reference to the charge amount output of the battery cell.

Referring to FIG. 7, the charge amount of the battery pack through state fusion is used in the safe region (20%<SOC<80%) as a result of estimating the charge amount of the battery module. Safe operation of the battery operating system is possible by using the highest value of the charge amount of the battery cell in an interval of 80% or more and using the lowest value of the charge amount of the battery cell in an interval of 20% or less based on the charge amount of the fused battery pack.

A vehicle according to an embodiment of the disclosure may determine an accurate state of a battery cell even when a small number of sensors are applied to the battery system.

The disclosed embodiments may be embodied in the form of a non-transitory recording medium storing instructions executable by a computer. The instructions may be stored in the form of program code. When executed by a processor, the instructions may generate a program module to perform the operations of the disclosed embodiments. The recording medium may be embodied as a computer-readable recording medium.

The computer-readable recording medium includes all kinds of recording media in which instructions which can be decoded by a computer are stored, for example, a Read Only Memory (ROM), a Random Access Memory (RAM), a magnetic tape, a magnetic disk, a flash memory, an optical data storage device, and the like.

Although embodiments of the disclosure have been described for illustrative purposes, those of ordinary skill in the art should appreciate that various modifications, additions and substitutions are possible, without departing from the scope and spirit of the disclosure. Therefore, the embodiments of the disclosure have not been described for limiting purposes.

A vehicle according to an embodiment of the present disclosure may determine an accurate state of a battery cell even when a small number of sensors are applied to the battery system.

What is claimed is:

1. A vehicle comprising:
a battery module comprising a plurality of battery cells;
a battery pack comprising a plurality of battery modules;
a battery cell sensor configured to measure voltages of the plurality of battery cells;
a battery module sensor configured to measure a voltage of the battery module and a current of the battery module; and
a controller configured to perform data processing based on data obtained by the battery cell sensor and the battery module sensor,
wherein the controller is further configured to:
obtain a first charge amount of the battery cell and a correction value of the battery cell based on the voltage of the battery cell and the current of the battery module;
obtain a first error covariance of the battery cell and Kalman gain of the battery cell based on the first charge amount of the battery cell and the correction value of the battery cell;
obtain a second error covariance of the battery cell by fusing the first error covariance and the Kalman gain;
obtain a charge amount of the battery module and a charge amount of the battery pack based on the voltage of the battery module, the current of the battery module, the second error covariance, and the Kalman gain;
obtain a second charge amount of the battery cell corrected from the first charge amount based on the charge amount of the battery module and the charge amount of the battery pack; and
output the second charge amount of the battery cell.

2. The vehicle according to claim 1, wherein the controller is configured to obtain the first charge amount of the battery cell and the correction value of the battery cell based on a value obtained by dividing the current of the battery module by a parallel number of the battery module.

3. The vehicle according to claim 1, wherein the controller is configured to obtain the first error covariance and the Kalman gain based on an extended Kalman filter.

4. The vehicle according to claim 1, wherein the correction value of the battery cell comprises an estimated voltage of the battery cell, a model error of the battery cell, and a system variable of the battery cell.

5. The vehicle according to claim 1, wherein the controller is configured to determine an initial value based on a pre-stored charge/discharge curve.

6. The vehicle according to claim 1, wherein the controller is configured to output a charge amount of the battery pack when the second charge amount of the battery cell is 20% or more and 80% or less than a full charge amount of the battery pack.

7. The vehicle according to claim 1, wherein the controller is configured to output a full charge amount of the battery cell when the second charge amount of the battery cell is greater than 80% of the full charge amount of the battery cell.

8. The vehicle according to claim 1, wherein the controller is configured to output a minimum charge amount of the battery cell when the second charge amount of the battery cell is less than 20% of the full charge amount of the battery cell.

9. A control method of a vehicle, the control method comprising:
measuring, by a battery cell sensor, a voltage of a battery cell; measuring, by a battery module sensor, a voltage of a battery module, and a current of the battery module;
obtaining, by a controller, a first charge amount of the battery cell and a correction value of the battery cell based on the voltage of the battery cell and the current of the battery module;
obtaining, by the controller, first error covariance of the battery cell and Kalman gain of the battery cell based on the first charge amount of the battery cell and the correction value of the battery cell;
obtaining, by the controller, a second error covariance of the battery cell by fusing the first error covariance and the Kalman gain; obtaining, by the controller, a charge amount of the battery module and a charge amount of a battery pack based on the voltage of the battery module, the current of the battery module, the second error covariance, and the Kalman gain;
obtaining, by the controller, a second charge amount of the battery cell corrected from the first charge amount based on the charge amount of the battery module and the charge amount of the battery pack; and
outputting, by the controller, the second charge amount of the battery cell.

10. The control method according to claim 9, wherein the obtaining the first charge amount of the battery cell and the correction value of the battery cell comprises:
obtaining the first charge amount of the battery cell and the correction value of the battery cell based on a value obtained by dividing the current of the battery module by a parallel number of the battery module.

11. The control method according to claim 9, wherein the obtaining first error covariance of the battery cell and Kalman gain of the battery cell comprises:
obtaining the first error covariance and the Kalman gain based on an extended Kalman filter.

12. The control method according to claim 9, wherein the correction value of the battery cell comprises an estimated voltage of the battery cell, a model error of the battery cell, and a system variable of the battery cell.

13. The control method according to claim 9, wherein the obtaining the first charge amount of the battery cell and the correction value of the battery cell based on the voltage of the battery cell and the current of the battery module comprises:
    determining an initial value based on a pre-stored charge/discharge curve.

14. The control method according to claim 9, wherein the outputting the second charge amount of the battery cell comprises:
    outputting a charge amount of the battery pack when the second charge amount of the battery cell is 20% or more and 80% or less than a full charge amount of the battery pack.

15. The control method according to claim 9, wherein the outputting the second charge amount of the battery cell comprises:
    outputting a full charge amount of the battery cell when the second charge amount of the battery cell is greater than 80% of the full charge amount of the battery cell.

16. The control method according to claim 9, wherein the outputting the second charge amount of the battery cell comprises:
    outputting a minimum charge amount of the battery cell when the second charge amount of the battery cell is less than 20% of the fullsharge amount of the battery cell.

\* \* \* \* \*